United States Patent
Bundza et al.

(10) Patent No.: US 7,312,993 B2
(45) Date of Patent: Dec. 25, 2007

(54) ELECTRONICS EQUIPMENT CABINET

(75) Inventors: Nicholas Adam Bundza, Ottawa (CA);
Stefano De Cecco, Ottawa (CA);
Angelo Arlotta, Ottawa (CA)

(73) Assignee: Alcatel Lucent, Paris (FR)

( * ) Notice: Subject to any disclaimer, the term of this patent is extended or adjusted under 35 U.S.C. 154(b) by 108 days.

(21) Appl. No.: 11/313,748

(22) Filed: Dec. 22, 2005

(65) Prior Publication Data
US 2007/0144704 A1 Jun. 28, 2007

(51) Int. Cl.
*H05K 7/20* (2006.01)

(52) U.S. Cl. ............ 361/696; 361/695; 361/697; 165/104.33; 165/122; 454/184

(58) Field of Classification Search ........... None
See application file for complete search history.

(56) References Cited

U.S. PATENT DOCUMENTS

| | | | |
|---|---|---|---|
| 5,467,250 A * | 11/1995 | Howard et al. ............ | 361/696 |
| 6,164,369 A | 12/2000 | Stoller | |
| 6,225,554 B1 | 5/2001 | Trehan et al. | |
| 6,652,373 B2 * | 11/2003 | Sharp et al. ............ | 454/184 |
| 6,742,583 B2 * | 6/2004 | Tikka ............ | 165/291 |
| 6,775,137 B2 * | 8/2004 | Chu et al. ............ | 361/696 |
| 6,877,551 B2 | 4/2005 | Stoller | |
| 6,889,752 B2 | 5/2005 | Stoller | |
| 7,254,022 B2 * | 8/2007 | Ebermann ............ | 361/696 |
| 2005/0016195 A1 * | 1/2005 | Bretschneider et al. ....... | 62/263 |

* cited by examiner

*Primary Examiner*—Boris Chervinsky
(74) *Attorney, Agent, or Firm*—Kramer & Amado, P.C.

(57) ABSTRACT

A cabinet for electronics equipment, comprising: a compartment for installing the electronics equipment; a door for accessing the compartment; an outer duct mounted on an outer surface of the door for directing exterior air around a heat exchanger core mounted in the door, the heat exchanger core for transferring heat from interior air in the compartment to the exterior air to thereby cool the interior air; an exhaust duct extending over a top surface of the compartment and pneumatically coupling with the outer duct when the door is in a closed position, the exhaust duct for exhausting the exterior air and for reducing solar loading on the top surface by transferring heat absorbed by the exhaust duct to the exterior air passing therethrough; and, one or more fans for forcing the exterior air in through the outer duct, around the heat exchanger core, and out through the exhaust duct, the one or more fans being mounted between the outer duct and the exhaust duct to thereby attenuate noise emitted by the one or more fans.

52 Claims, 14 Drawing Sheets

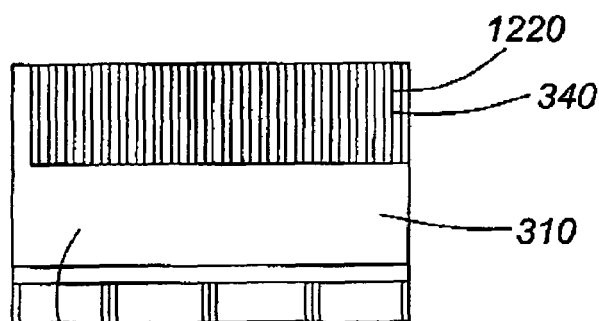
FIG. 12
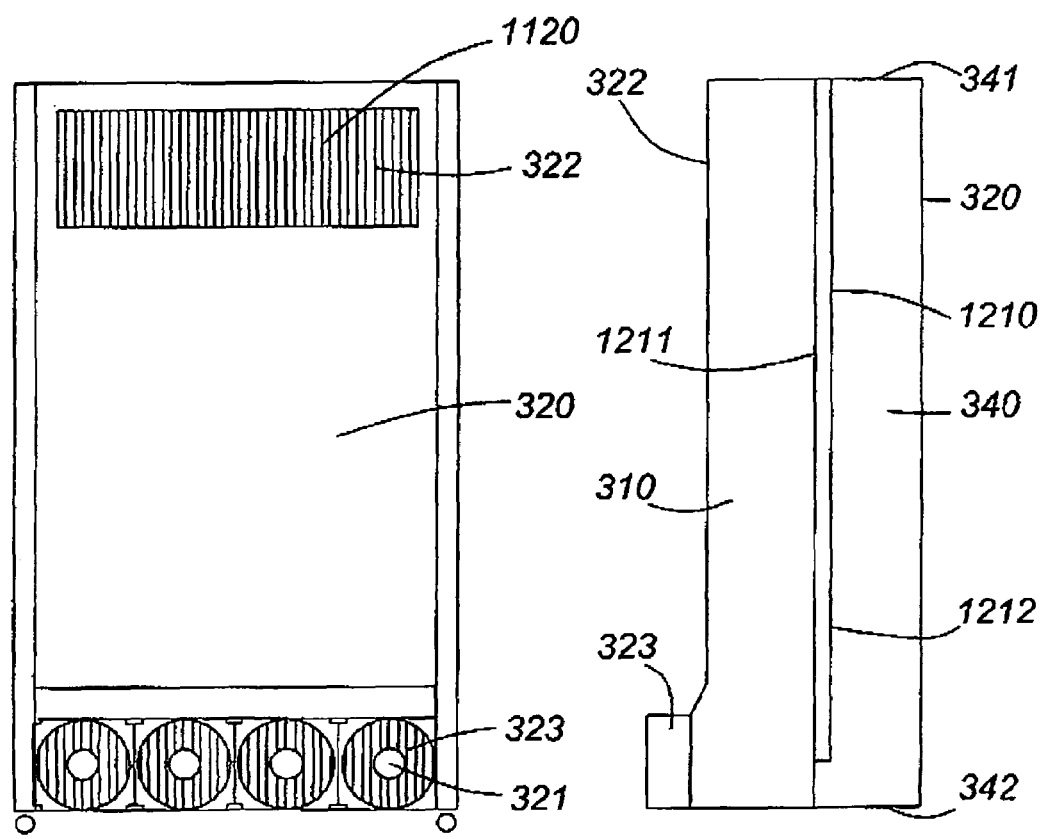
FIG. 11  FIG. 13

ELECTRONICS EQUIPMENT CABINET

FIELD OF THE INVENTION

This invention relates to the field of equipment cabinets, and more specifically, to cabinets for electronics equipment.

BACKGROUND OF THE INVENTION

The power requirements of electronics equipment (e.g., telecommunications equipment) is continually increasing. In particular, newer generation telecommunications equipment has increased power density. That is, the power requirements of such equipment per unit volume has increased. As a result, this newer generation equipment dissipates more heat during operation than older generation equipment. Dissipating heat from electronics equipment is important as excess operating temperatures may decrease the operating performance and life-span of the equipment. As such, electronics equipment installed in cabinets require sufficient cooling to ensure optimal operating performance and life-span. This is especially so for electronics equipment cabinets that are weatherproofed for outdoor use.

Several existing electronics equipment cabinets rely on the natural convection of heat dissipated from enclosed equipment to the exterior cabinet walls where it is then conducted to the external environment thereby providing cooling. However, such natural convection cooling techniques are typically not sufficient to provide the cooling needed to promote optimal performance of newer generation electronics equipment.

Other existing electronics equipment cabinets relay on forced convection cooling using fans, heat exchangers, etc. Refer to, for example, U.S. Pat. No. 6,164,369 to Stoller. However, the fans used in such equipment often generates excessive noise. This is problematic as noise emission limits for electronics equipment cabinets installed in the field are being routinely lowered.

A need therefore exists for an improved electronics equipment cabinet. Accordingly, a solution that addresses, at least in part, the above and other shortcomings is desired.

SUMMARY OF THE INVENTION

According to one aspect of the invention, there is provided a cabinet for electronics equipment, comprising: a compartment for installing the electronics equipment; a door for accessing the compartment; an outer duct mounted on an outer surface of the door for directing exterior air around a heat exchanger core mounted in the door, the heat exchanger core for transferring heat from interior air in the compartment to the exterior air to thereby cool the interior air; an exhaust duct extending over a top surface of the compartment and pneumatically coupling with the outer duct when the door is in a closed position, the exhaust duct for exhausting the exterior air and for reducing solar loading on the top surface by transferring heat absorbed by the exhaust duct to the exterior air passing therethrough; and, one or more fans for forcing the exterior air in through the outer duct, around the heat exchanger core, and out through the exhaust duct, the one or more fans being mounted between the outer duct and the exhaust duct to thereby attenuate noise emitted by the one or more fans.

Advantageously, the noise generated by the fans is attenuated as it passes along the outer and exhaust ducts, the fans being located between the two. To provide further noise attenuation, noise insulation may be added to the exhaust duct and to a door intake duct extending the outer duct. These ducts also serve to insulate the electronics compartment from solar loading on corresponding external surfaces.

BRIEF DESCRIPTION OF THE DRAWINGS

Further features and advantages of the embodiments of the present invention will become apparent from the following detailed description, taken in combination with the appended drawings, in which:

FIG. 11 is a front view of the heat exchanger mounted in the front door of FIG. 9;

FIG. 12 is a top view of the heat exchanger of FIG. 11;

FIG. 13 is a right side view of the heat exchanger of FIG. 11;

It will be noted that throughout the appended drawings, like features are identified by like reference numerals.

DETAILED DESCRIPTION OF THE EMBODIMENTS

In the following description, details are set forth to provide an understanding of the invention. In some instances, certain circuits, structures and techniques have not been described or shown in detail in order not to obscure the invention.

Figure 1:
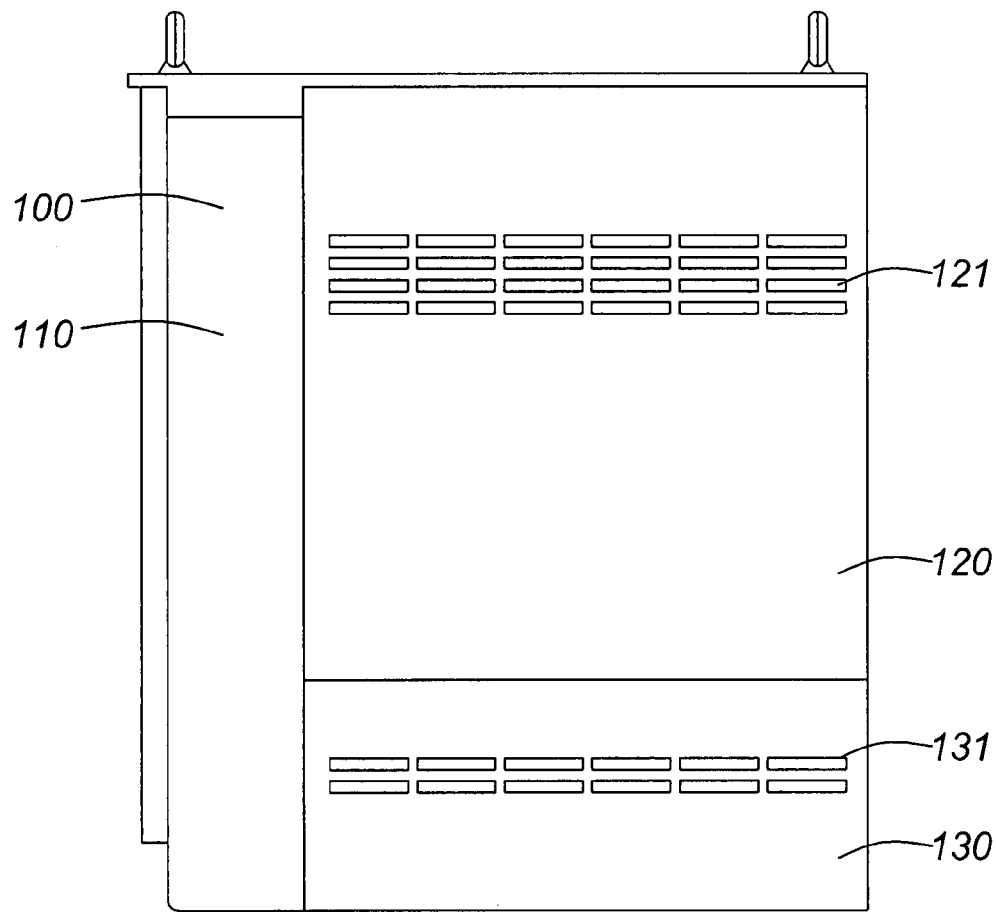
FIG. 1 is a front view illustrating an electronics equipment cabinet in accordance with an embodiment of the invention.
Figure 2:
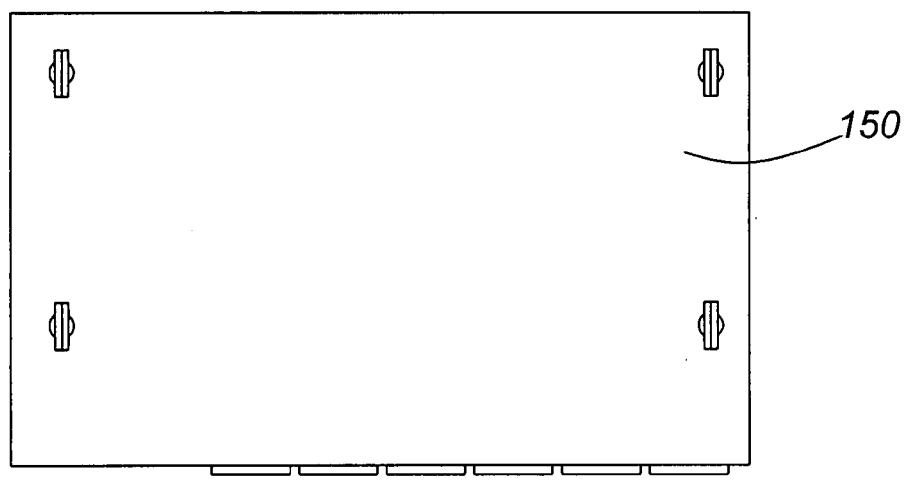
FIG. 2 is a top view of the electronics equipment cabinet of FIG. 1.
Figure 3:
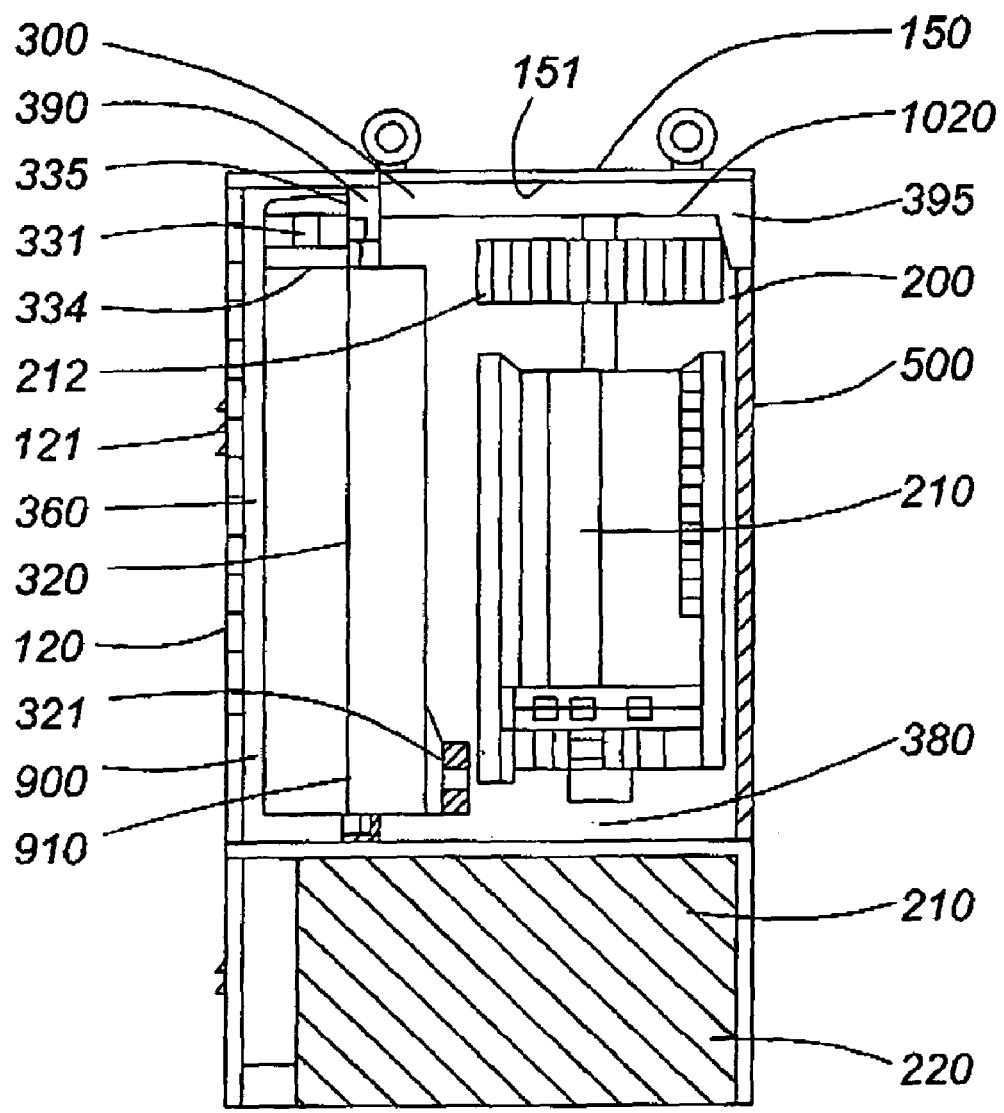
FIG. 3 is a section view of the electronics equipment cabinet of FIG. 1 (along line A-A in FIG. 1)

FIG. 1 is a front view illustrating an electronics equipment cabinet 100 in accordance with an embodiment of the invention. FIG. 2 is a top view of the cabinet 100. FIG. 3 is a section view of the cabinet 100 (along line A-A in FIG. 1).

Figure 4:
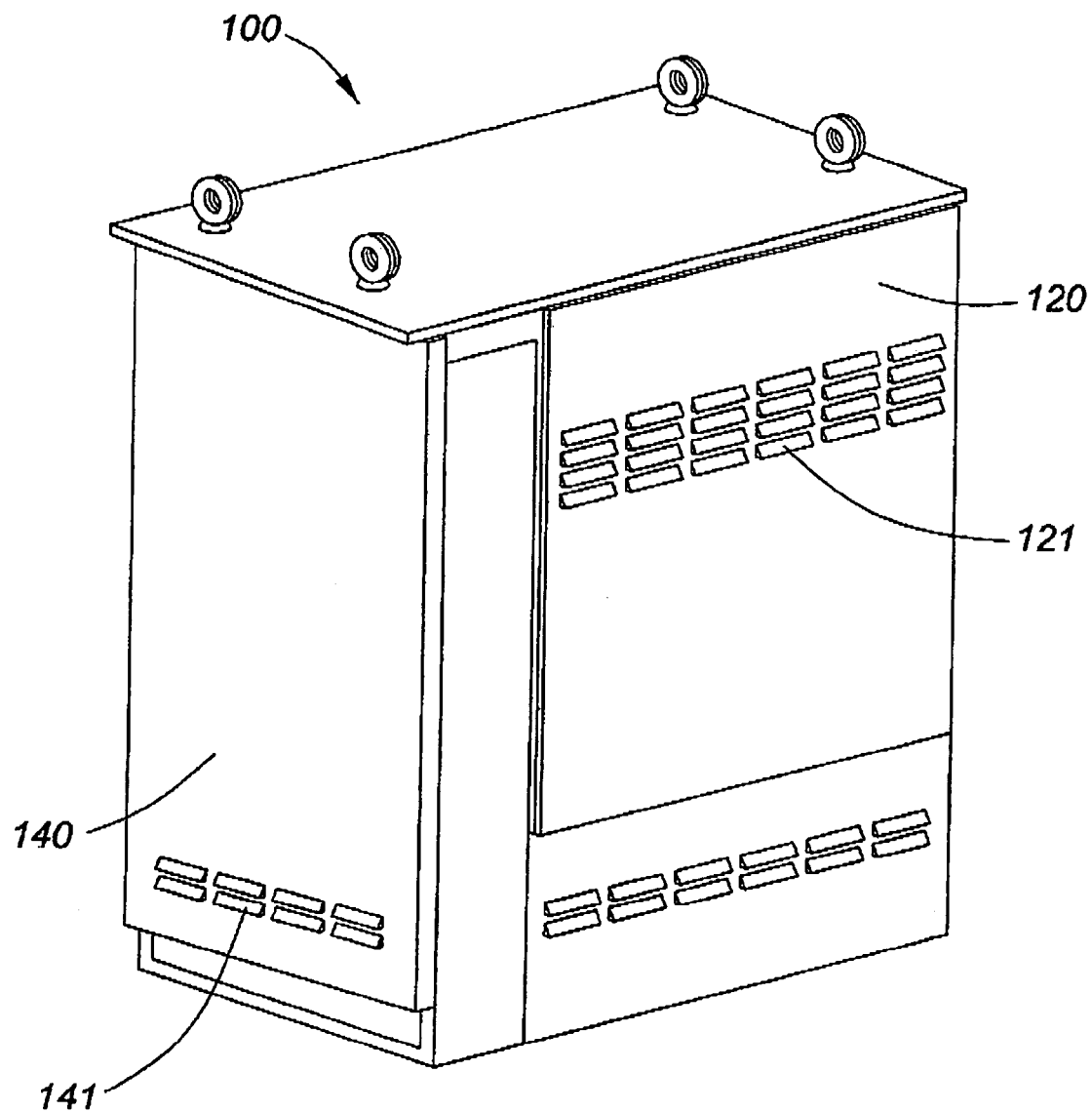
FIG. 4 is a front perspective view of the electronics equipment cabinet of FIG. 1.
Figure 5:
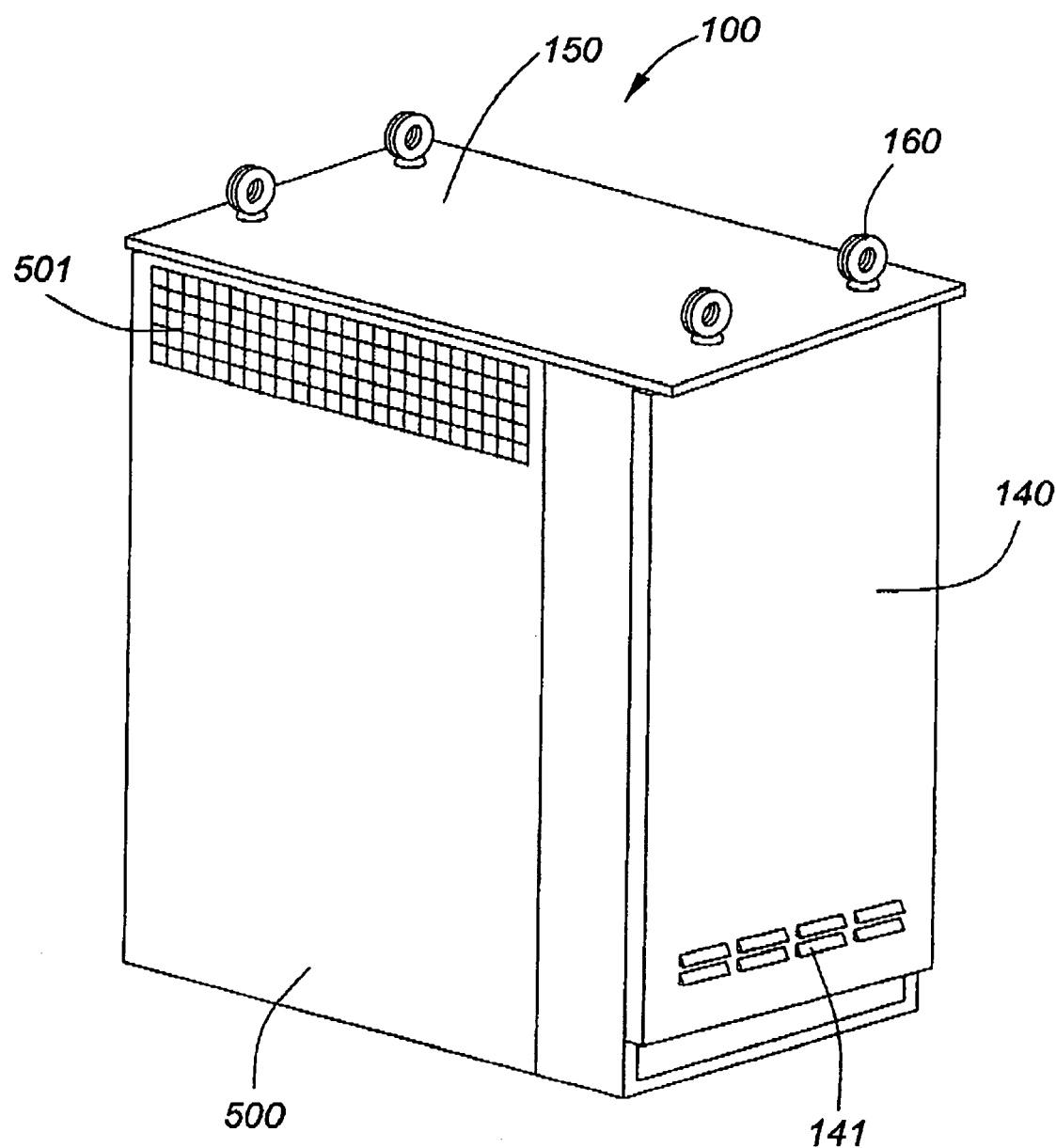
FIG. 5 is a rear perspective view of the electronics equipment cabinet of FIG. 1.
Figure 6:
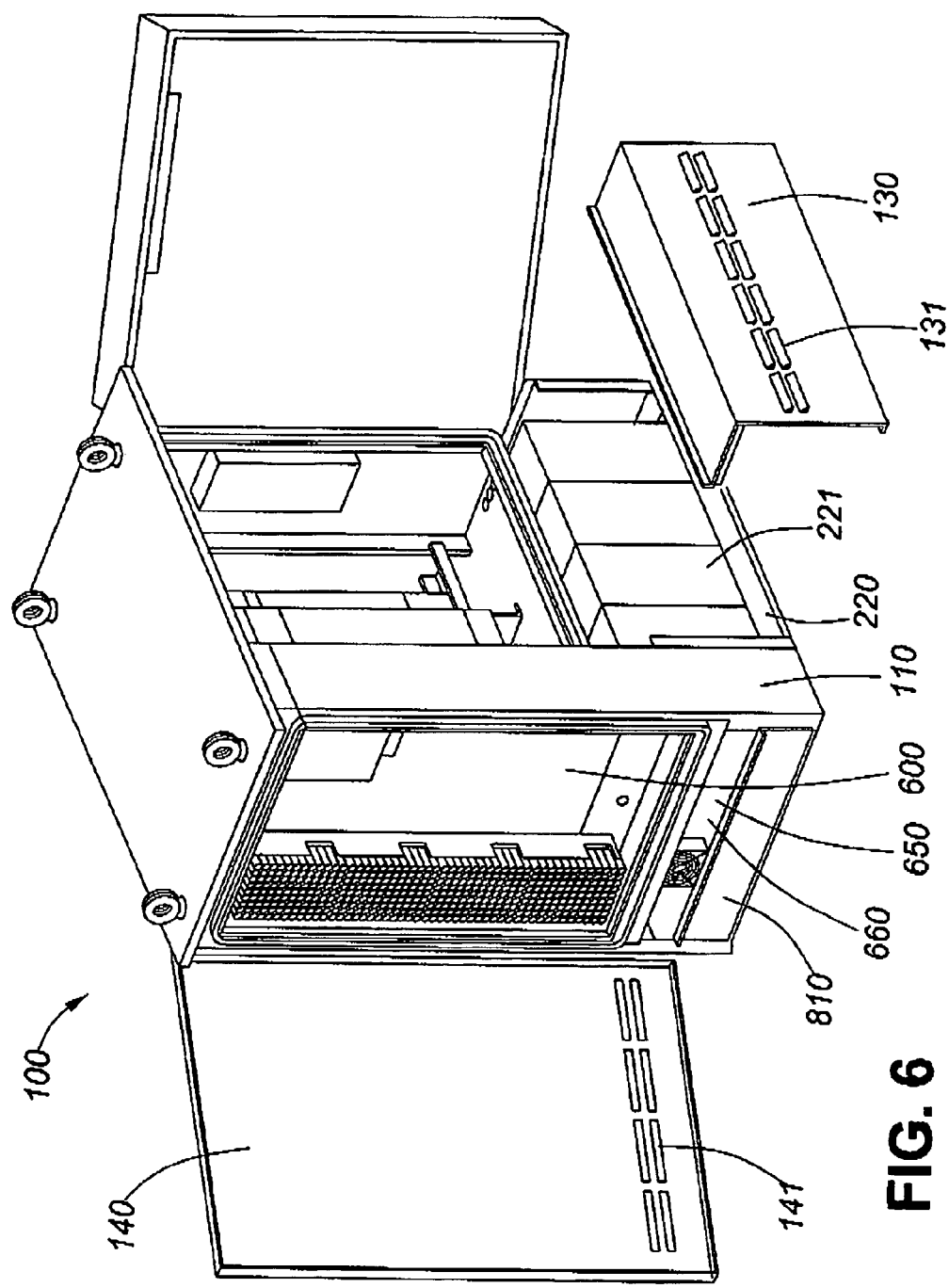
FIG. 6 is a front perspective exploded view of the electronics equipment cabinet of FIG. 1.
Figure 7:
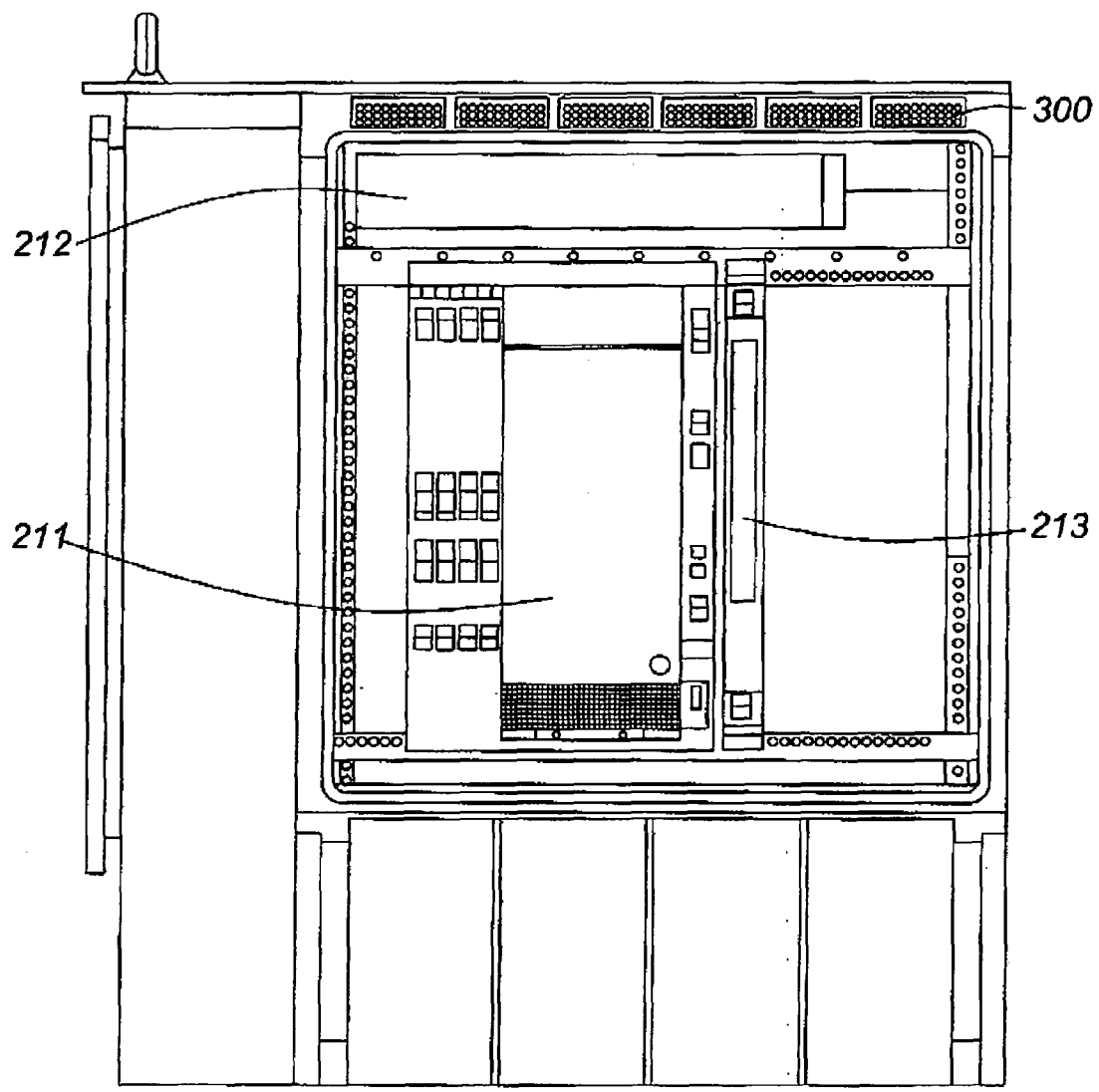
FIG. 7 is a front view (doors and panels removed) of the electronics equipment cabinet of FIG. 1.
Figure 8:
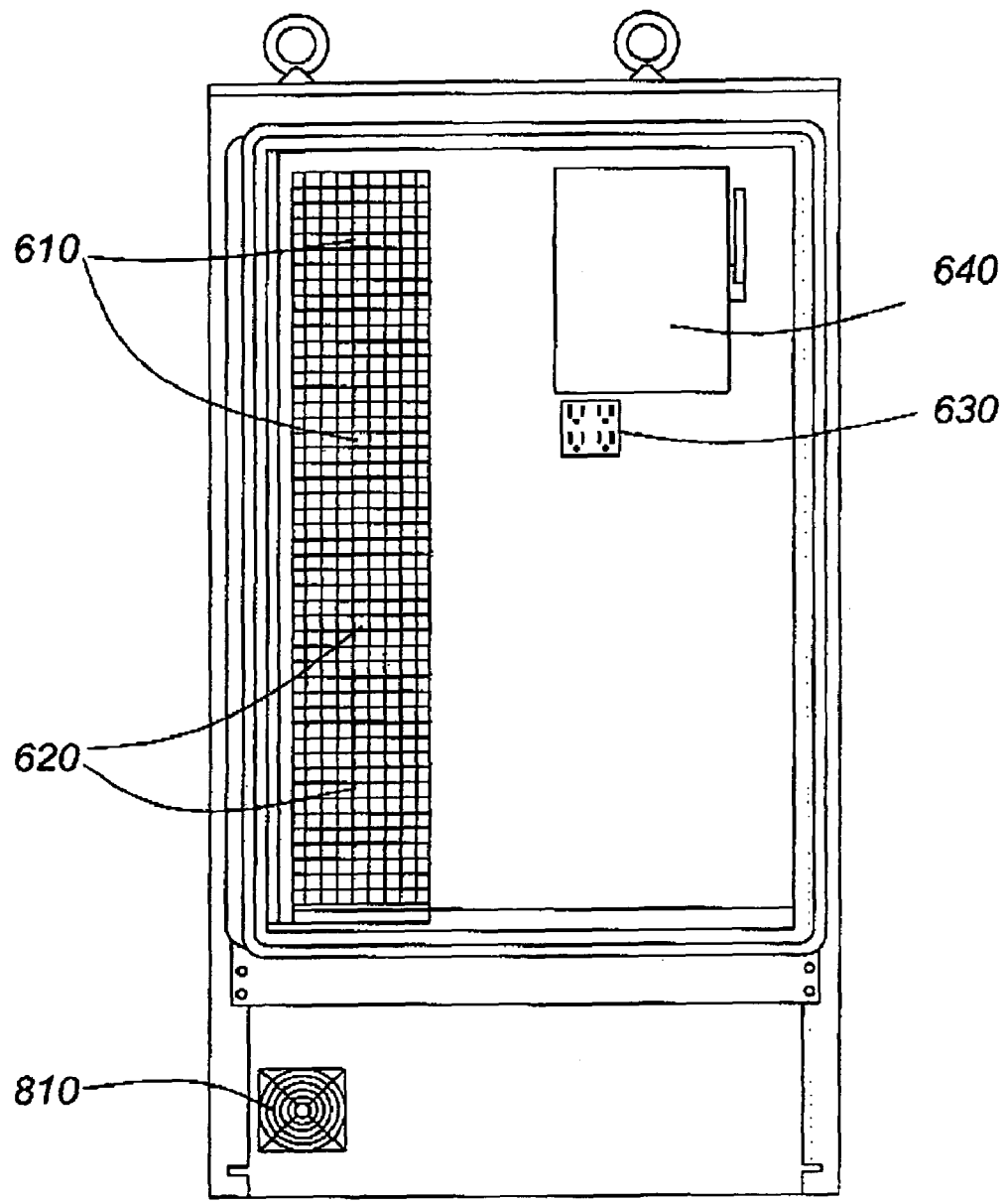
FIG. 8 is a left side view (doors and panels removed) of the electronics equipment cabinet of FIG. 1.

FIG. 4 is a front perspective view of the cabinet 100. FIG. 5 is a rear perspective view of the cabinet 100. FIG. 6 is a front perspective exploded view of the cabinet 100. FIG. 7 is a front view (doors and panels removed) of the cabinet 100. And, FIG. 8 is a left side view (doors and panels removed) of the cabinet 100.

Referring to FIGS. 1-8, the cabinet 100 has a frame or housing 110 in which is formed an electronics equipment compartment 200, a battery compartment 220, a splice compartment 600, and a cable entry compartment 660. In this embodiment, the electronics equipment compartment 200 is positioned above the battery compartment 220 and the splice compartment 600 is positioned above the cable entry compartment 660, the splice and cable entry compartments 600, 660 being generally adjacent to the electronics equipment and battery compartments 200, 220, respectively.

The electronics equipment compartment 200 has a front door 120 for providing access to the compartment 200 and to an exhaust duct 300, which will be described below. The electronics equipment compartment 200 is for mounting electronics equipment 210 such as telecommunications equipment 211, DC (Direct Current) power supplies 212, and fiber termination panels 213. The front door 120 has ventilation openings 121, the operation of which will be described in more detail below. The front door 120 may be mounted to the housing 110 or compartment 200 with hinges, pins, etc.

The battery compartment 220 has a removable cover 130 for providing access to the compartment 220. The battery compartment 220 is for mounting batteries 221 to provide standby power to the electronics equipment 210. The removable cover 130 has ventilation openings 131, the operation of which will be described in more detail below. The removable cover 130 may be mounted to the housing 110 with tabs, pins, etc.

The splice and cable entry compartments 600, 660 share a side door 140 for providing access to these compartments 600, 660. The side door 140 has ventilation openings 141 opening into the cable entry compartment 660, the operation of which will be described in more detail below. The splice compartment 600 is for mounting cable termination blocks 610, 620 for POTS (Plain Old Telephone Service) lines, DSL (Digital Subscriber Line) lines, etc. The splice compartment 600 may also house an AC (Alternating Current) power panel 640 for providing AC power to the DC power supplies 212 to power the electronics equipment 210 and an AC convenience outlet 630. The cable entry compartment 660 facilitates the entry of cables (not shown) to the splice compartment 600 and cabinet 100. These cables enter the cable entry compartment 660 though an opening 690 in the bottom of that compartment 660. The side door 140 may be mounted to the housing 110 with hinges, pins, etc.

Thus, the housing 110 has separate electronics equipment, battery, splice, and cable entry compartments 200, 220, 600, 660. Suitable openings (not shown) are provided between compartments for the passage of wiring (not shown).

Gases and heat generated by the batteries 221 are exhausted from the battery compartment 220 through the ventilation openings 131 in the battery compartment cover 130. To provided enhanced ventilation for the battery compartment 220, optionally, a fan 810 is mounted in the cable entry compartment 660 through the inner panel or wall 650 separating the cable entry compartment 660 from the battery compartment 220. Noting that the ventilation openings 141 in the side door 140 open into the cable entry compartment 660, the fan 810 functions to draw air in through the ventilation openings 141 in the side door 140, through the panel 650, across the battery compartment 220, and out through the ventilation openings 131 in the battery compartment cover 130. According to an alternate embodiment, the air flow is in the opposite direction with the fan 810 functioning to draw air in through the ventilation openings 131 in the battery compartment cover 130, across the battery compartment 220, through the panel 650, and out through the ventilation openings 141 in the side door 140.

Figure 9:
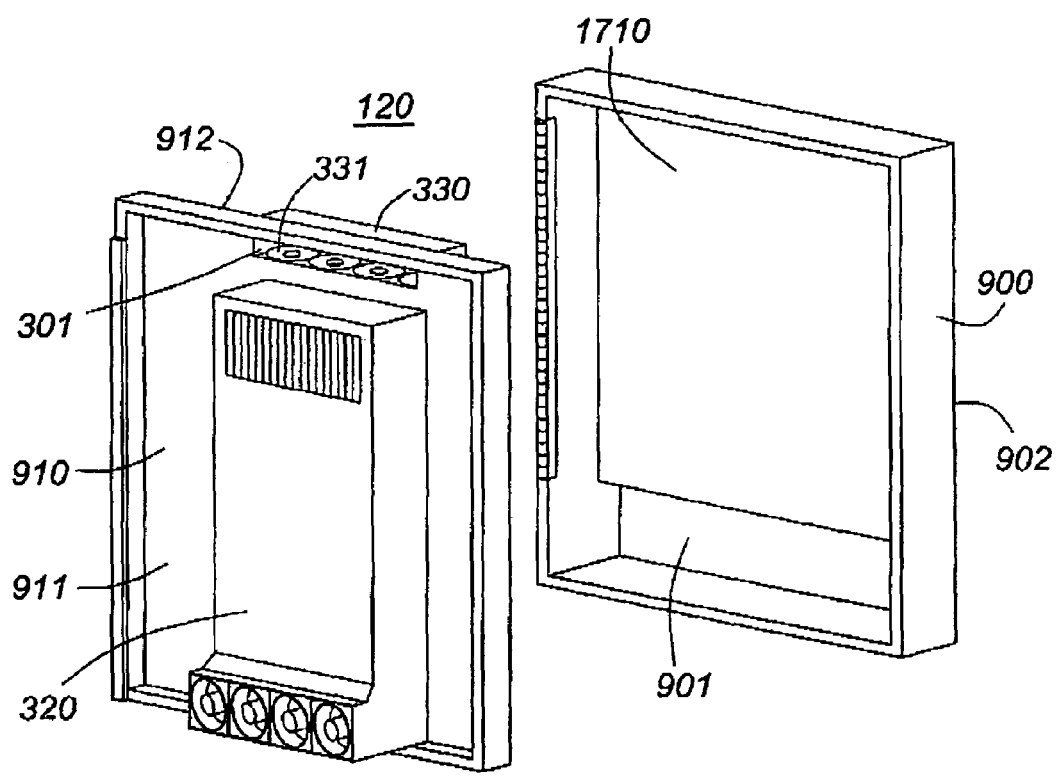
FIG. 9 is a perspective view (exploded) of the inner side of the front door of the electronics equipment cabinet of FIG. 1.
Figure 10:
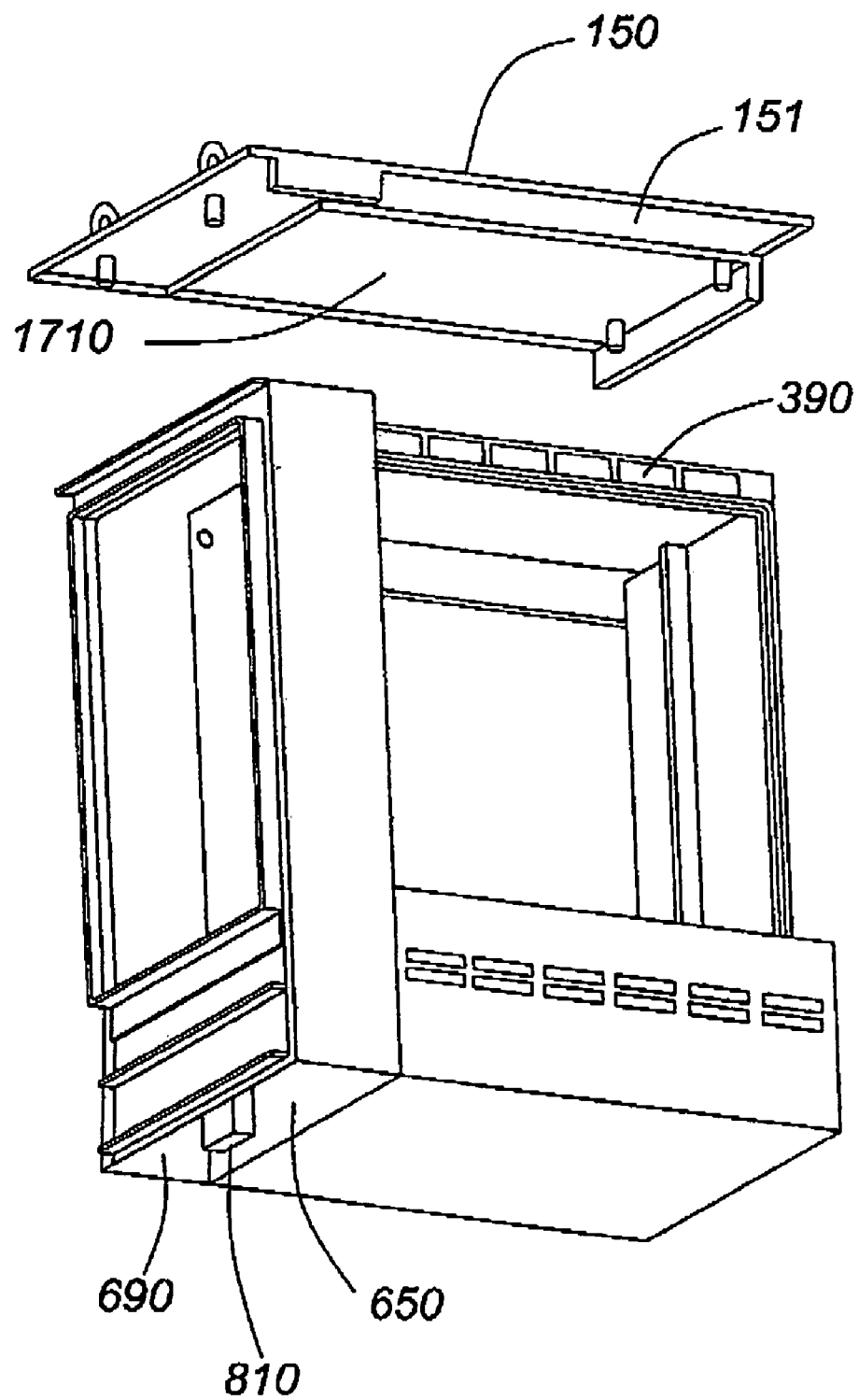
FIG. 10 is a front perspective view (top panel removed) of the electronics equipment cabinet of FIG. 1.
Figure 14:
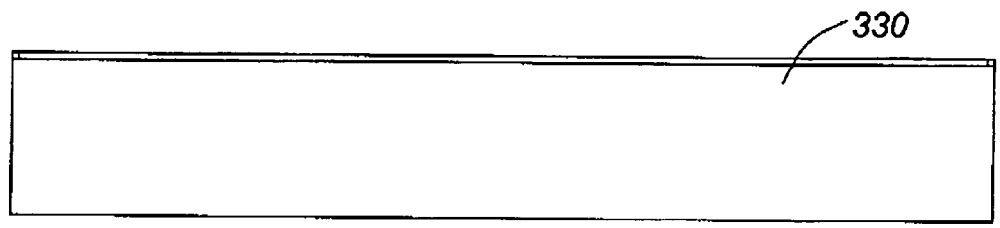
FIG. 14 is a front view of the outer loop fan module of the heat exchanger of FIG. 11.
Figure 15:
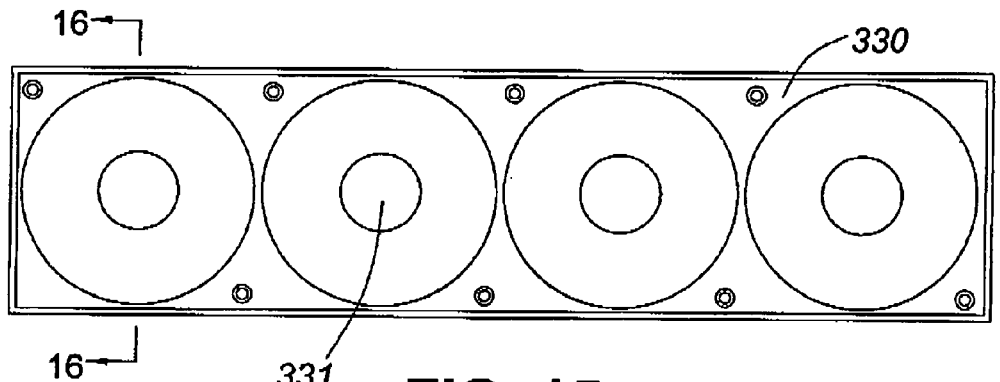
FIG. 15 is a top view of the outer loop fan module of FIG. 14.
Figure 16:
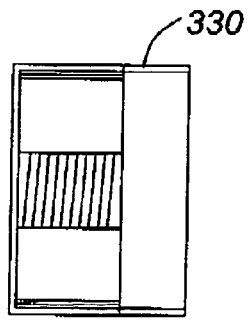
FIG. 16 is a section view of the outer loop fan module of FIG. 14 (along line A-A in FIG. 15)

FIG. 9 is a perspective view (exploded) of the inner side of the front door 120 of the electronics equipment cabinet 100 of FIG. 1. FIG. 10 is a front perspective view (top panel 150 removed) of the cabinet 100. FIG. 11 is a front view of the heat exchanger 320 mounted in the front door 120 of FIG. 9. FIG. 12 is a top view of the heat exchanger 320. FIG. 13 is a right side view of the heat exchanger 320. FIG. 14 is a front view of the outer loop fan module 330 of the heat exchanger 320 of FIG. 11. FIG. 15 is a top view of the outer loop fan module 330. And, FIG. 16 is a section view of the outer loop fan module 330 (along line A-A in FIG. 15).

Referring to FIGS. 1-16, the enclosure has a top casing or panel 150 spaced from a top surface 1020 of the electronics equipment compartment 200 to form an enclosed exhaust duct 300 therebetween. The exhaust duct 300 extends across the top of the electronics equipment compartment 200, from the front door 120 to the rear wall or panel 500 of the electronics equipment compartment 200. The exhaust duct 300 has a front inlet opening 390 at the front door 120 and a rear outlet opening 395 at the rear panel 500. In one embodiment, the rear panel 500 extends upwards to cap the rear opening 395 of the exhaust duct 300 and ventilation openings 501 for the exhaust duct 300 are provided in the rear panel 500. Of course, the ventilation openings 501 may be integrated into the top panel 150. When the front door 120 is in a closed position, the front inlet opening 390 of the exhaust duct 300 engages an outer loop fan module 330 of a heat exchanger 320 mounted in the front door 120, as will be described in more detail below. The top panel 150 may be provided with one or more lifting eyes 160 mounted therethrough to facilitate lifting of the cabinet 100.

The front door 120 has an outer casing or door 900 fitted over an inner panel or door 910. When the front door 120 is in the closed position, the inner surface 911 of the inner door 910 faces the interior of the electronics equipment compartment 200 and the front inlet opening 390 of the exhaust duct 300. The inner door 910 isolates the electronics equipment compartment 200 from the exterior environment when the front door 120 is closed. The outer door 900 is mounted over the outer surface 912 of the inner door 910. The outer surface 902 of the outer door 900 faces the environment while the inner surface 901 of the outer door 900 faces the outer surface 912 of the inner door 910. The outer door 900 is box-shaped such that when it is mounted over the outer surface 912 of the inner door 910 an enclosed door intake duct 360 is formed. The ventilation openings 121 in the outer door 120 open into this door intake duct 360. In normal operation, the outer door 900 and inner door 910 are fastened together and function as one unit (i.e., a single door).

The heat exchanger 320 is mounted in the inner door 910. The heat exchanger 320 has a enclosed outer loop duct 340 mounted on the outer surface 912 of the inner door 910. In addition, the heat exchanger 320 has an enclosed inner loop duct 310 mounted on the inner surface 911 of the inner door 910. The outer loop duct 340 and the inner loop duct 310 are generally coextensive being separated by a heat exchanger core 1210 which may be, or form, a portion of the inner door 910. The heat exchanger core has an inner surface 1211 facing the inner loop duct 310 and an outer surface 1212 facing the outer loop duct 340. It is through the heat exchanger core 1210 that heat from the interior air in the electronics equipment compartment 200 will be dissipated to the external environment. Thus, the outer loop duct 340 is located in the door compartment 360 and the inner loop duct 310 is located in the electronics equipment compartment 200.

According to one embodiment, the outer loop duct 340 is spaced from the inner surface 901 of the outer door 900. This spacing allows for the optional application of sound insulation 1710 and/or thermal insulation 1720 on the inner surface 901 of the outer door 900 and for the circulation of air within the door intake duct 360.

The outer loop duct 340 of the heat exchanger 320 has vertical heat radiating fins 1220 disposed therein and forming part of the heat exchanger core 1210 to improve heat transfer efficiency. Alternatively, the fins 1220 may be heat pipes, corrugated surfaces, or other heat exchanging elements known in the art. The outer loop duct 340 has an outlet opening 341 at its top end and an inlet opening 342 at its bottom end allowing for the passage of air therethrough.

The inner loop duct 310 has an inlet opening 322 at its top end and an outlet opening 323 at its bottom end allowing for the passage of air therethrough. Both the inlet and outlet openings 322, 323 face into the electronics equipment compartment 200. Like the outer loop duct 340, the inner loop duct 310 has vertical heat radiating fins 1120 disposed therein and forming part of the heat exchanger core 1210 to improve heat transfer efficiency. Alternatively, the fins 1120 may be heat pipes, corrugated surfaces, or other heat exchanging elements known in the art. In addition, the inner loop duct 310 has one or more fans 321 mounted at the bottom outlet opening 323 for drawing air in the electronics equipment compartment 200 over the electronics equipment 210, through the top inlet opening 322 in the inner loop duct 310, over the fins 1120 of the heat exchanger core 1210 disposed in the inner loop duct 310, and out through the bottom outlet opening 323 of the inner loop duct 310. This air flow will be referred to as the inner loop air flow 1910 below. According to an alternate embodiment, the fans 321 may be located at the top inlet opening 322.

According to one embodiment, the fins 1120, 1220 may represent opposite sides of a corrugated surface forming the heater exchanger core 1210.

An outer loop fan module 330 is mounted above the top outlet opening 341 of the outer loop duct 340 on the outer surface 912 of the inner door 910. The outer loop fan module 330 is mounted over an opening 301 in the inner door 910 which, when the front door 120 is in a closed position, is aligned with the front inlet opening 390 of the exhaust duct 300. The outer loop fan module 330 is elbow-duct shaped having a bottom inlet opening 334 aligned with the top outlet opening 341 of the outer loop duct 340 and having a top outlet opening 335 aligned with the opening 301 in the inner door 910. In addition, the outer loop fan module 330 has one or more fans 331 mounted therein for drawing air from the external environment through the ventilation openings 121 in the front door 120, through the door intake duct 360, through the bottom inlet opening 342 of the outer loop duct 340, over the fins 1220 of the heat exchanger core 1210 disposed in the outer loop duct 340, through the top outlet opening 341 in the outer loop duct 310, through the bottom inlet opening 334 of the outer loop fan module 330, through the outer loop fan module 330, through the top outlet opening 335 of the outer loop fan module 330, through the opening 301 in the inner door 910, through the front inlet opening 390 of the exhaust duct 300, through the exhaust duct 300, through the rear outlet opening 395 of the exhaust duct 300, and out through the ventilation openings 501 in the rear panel 500. This air flow will be referred to as the outer loop air flow 1920 below.

Of course, rather than a separate outer loop fan module 330, the outer loop fan module 330 and the outer loop duct 340 may be a single unit.

Figure 17:
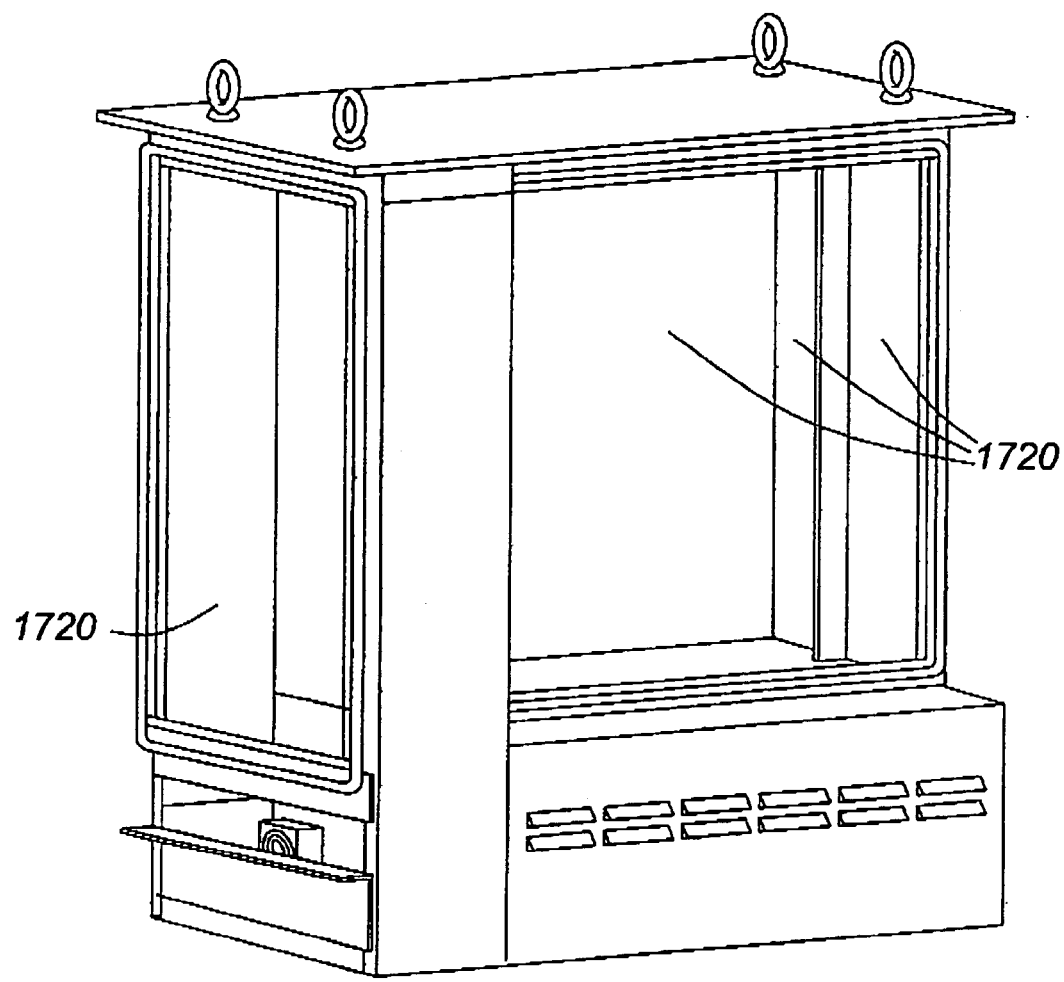
FIG. 17 is a front perspective view of the electronics equipment cabinet of FIG. 1 (doors and panels removed) illustrating the application of sound insulation and/or thermal insulation.
Figure 18:
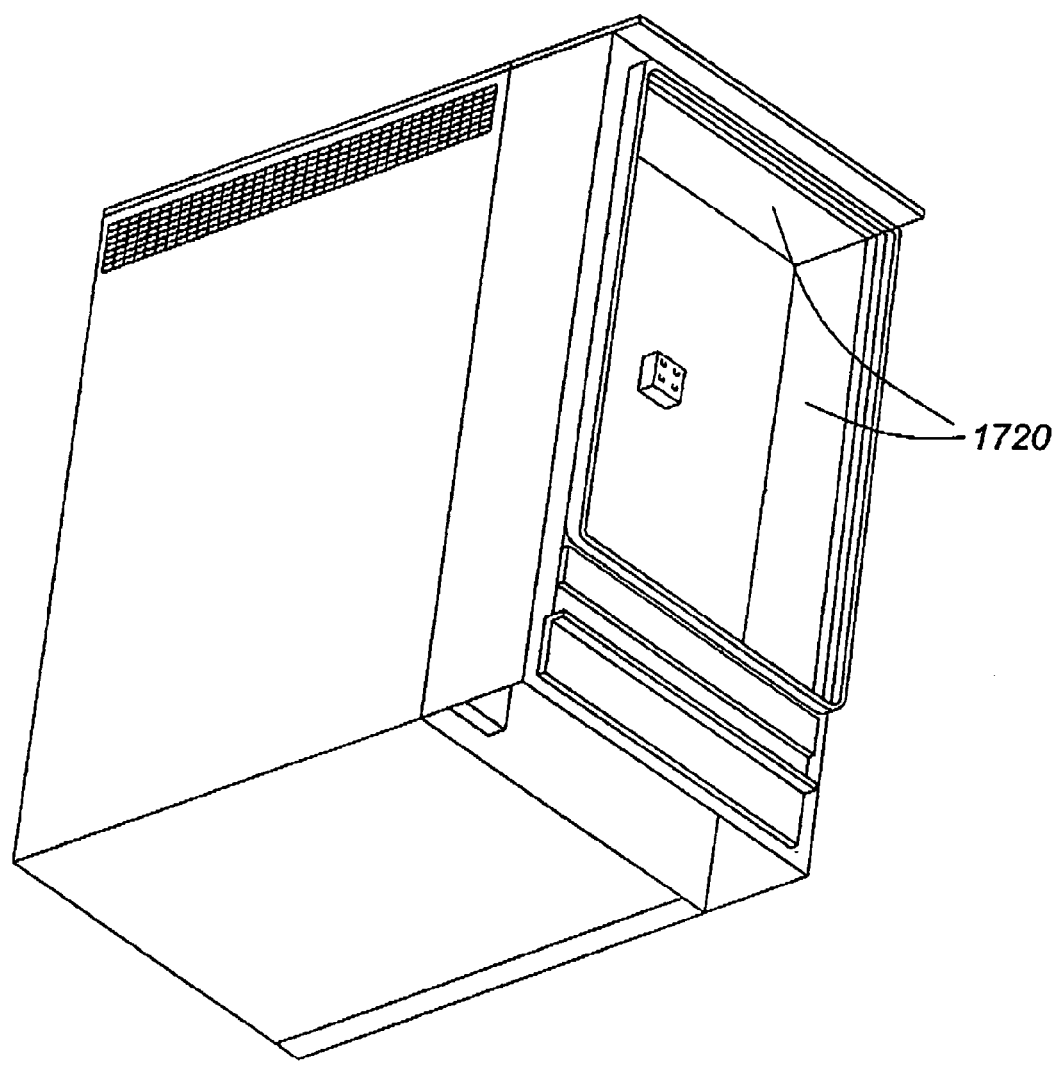
FIG. 18 a rear perspective view of the cabinet (doors and panels removed) illustrating the application of sound insulation and/or thermal insulation; and, FIG. 19 is a section view (along line A-A in FIG. 1) illustrating air flows through the electronics equipment cabinet.

FIG. 17 is a front perspective view of the electronics equipment cabinet 100 of FIG. 1 (doors 120, 140 and panels 130 removed) illustrating the application of sound insulation 1710 and/or thermal insulation 1720. And, FIG. 18 a rear perspective view of the cabinet 100 (doors 120, 140 and panels 130 removed) illustrating the application of sound insulation 1710 and/or thermal insulation 1720. To improve the thermal performance of the cabinet 100 and to reduce noise emissions, optional thermal insulation 1720 and/or sound insulation 1710 may be applied to the inner surface 901 of the front door 900, to the inner surface 151 of the top panel 150, and to the inner surfaces of exterior facing walls of the electronics equipment and splice compartments 200, 600. The sound insulation 1710 functions to reduce noise emissions generated by the fans 321, 331 and/or electronic equipment 210. The thermal insulation 1720 functions to reduce solar/thermal loading from the sun and/or the external environment.

Figure 19:
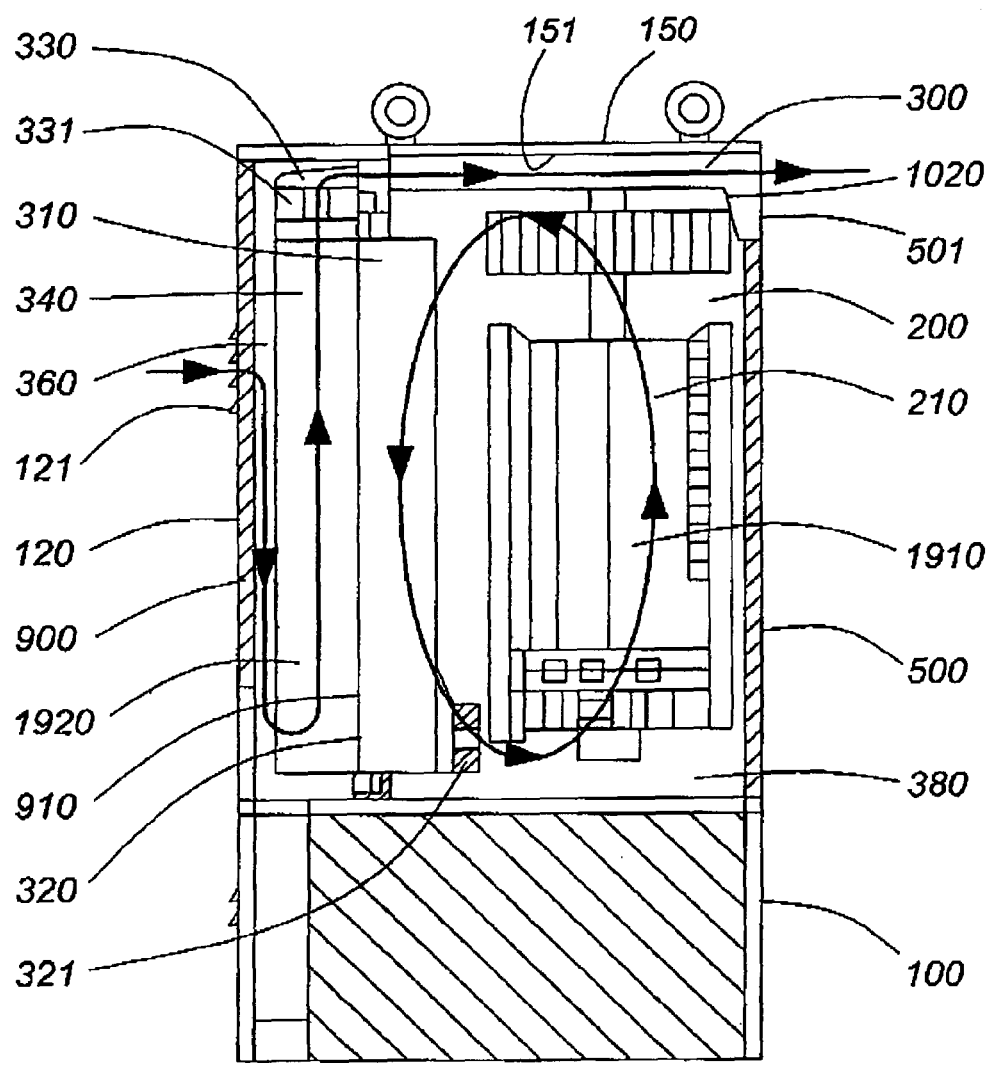

FIG. 19 is a section view (along line A-A in FIG. 1) illustrating air flows 1910, 1920 through the electronics equipment cabinet 100. In operation, with the front door 120 closed, inner loop air flow 1910 circulates warm interior air from the top of the electronics equipment compartment 200 through the inner loop duct 310 of the heat exchanger 320 where heat is transferred to cool exterior air being circulated through the outer loop duct 340 of the heat exchanger 320. The two air flows 1910 and 1920 are isolated and do not mix (i.e., exterior air does not enter the electronics equipment compartment 200). The interior air flows in a direction from top to bottom of the inner loop duct 310 while the exterior air flows in a direction from bottom to top of the outer loop duct 340. Thus, the heat exchanger 320 may be referred to as a "counterflow" heat exchanger. These opposite air flow directions improve the heat transfer efficiency of the heat exchanger 320. The cooled interior air exits the inner loop duct 310 into the bottom of the electronics equipment compartment 200 where it absorbs heat from the electronics equipment 210 and is warmed as it rises to the top of the compartment 200. One or more vertical baffles 380 may be provided at the bottom of the electronics equipment compartment 200, extending from the front to the back of the compartment 200, to distribute and direct the cooled air over the electronics equipment 210. The cool exterior air in the outer loop duct 340 absorbs heat from the interior air, is warmed, and is expelled through the exhaust duct 300. The top panel 150, being located on the top of the cabinet 100, absorbs heat from the sun (i.e., solar thermal loading) when the cabinet 100 is located outdoors. This heat is transferred from the inner surface 151 of the top panel 150 to the exterior air flowing through the exhaust duct 300 further warming this air before it is expelled through the ventilation openings 501 at the rear of the cabinet 100.

According to one embodiment, the air flows 1910, 1920 are facilitated by natural convection rather than by one or more of the inner loop and outer loop fans 321, 331. According to one embodiment, the cabinet 100 is primarily constructed from sheet metal.

Advantageously, the cabinet 100 and its front door 120 allows for the ducting 300, 360 of the outer loop air flow 1920 both before and after the fans 331 and heat exchanger 230. This ducting 300, 360 may have sound absorbing/attenuating material 1710 added to the walls thereof to create sound deadening spaces. This ducting 300, 360 also serves to insulate the electronics compartment 200 from solar loading on the corresponding external surfaces. The placement of the outer loop fan module 330 between the outer loop duct 340 and the exhaust duct 300, well away from the ventilation openings 121, 501 in the front door 120 and rear panel 500, reduces fan 331 noise emitted by the cabinet 100. In addition, this placement improves fan 331 life as the fans 331, being remote from the ventilation openings 121, 501, are protected from the elements (i.e., rain, snow, dust, etc.). Furthermore, the reduction in solar loading on the top panel 150 by the exhaust duct 300 allows for a smaller capacity heat exchanger 320 and fans 321, 331 further enhancing the efficiency of the cabinet 100. In addition, the baffling 380 provided in the electronics equipment compartment 200 improves circulation of cooled interior air over the heat producing electronics equipment 210 hence increasing heat transfer from this equipment. Moreover, the location of the ventilation openings 121, 501 on opposite sides (i.e., front and back) of the cabinet 100 helps to prevent re-circulation of exterior air hence improving the thermal efficiency of the cabinet.

The embodiments of the invention described above are intended to be exemplary only. Those skilled in this art will understand that various modifications of detail may be made to these embodiments, all of which come within the scope of the invention.

What is claimed is:

1. A cabinet for electronics equipment, comprising:
   a compartment for installing the electronics equipment;
   a door for accessing the compartment;
   an outer duct mounted on an outer surface of the door for directing exterior air around a heat exchanger core mounted in the door, the heat exchanger core for transferring heat from interior air in the compartment to the exterior air to thereby cool the interior air;
   an exhaust duct extending over a top surface of the compartment and pneumatically coupling with the outer duct when the door is in a closed position, the exhaust duct for exhausting the exterior air and for reducing solar loading on the top surface by transferring heat absorbed by the exhaust duct to the exterior air passing therethrough; and,
   one or more fans for forcing the exterior air in through the outer duct, around the heat exchanger core, and out through the exhaust duct, the one or more fans being mounted between the outer duct and the exhaust duct to thereby attenuate noise emitted by the one or more fans.

2. The cabinet of claim 1 and further comprising an inner duct mounted on an inner surface of the door for circulating the interior air over the heat exchanger core.

3. The cabinet of claim 2 and further comprising one or more fans for forcing the interior air through the inner duct.

4. The cabinet of claim 3 wherein the one or more fans are disposed at least one of a lower outlet opening in the inner duct and an upper inlet opening of the inner duct.

5. The cabinet of claim 1 wherein the outer duct has a lower inlet opening and an upper outlet opening, wherein the exhaust duct has a front inlet opening and a rear outlet opening, and wherein the one or more fans are disposed between the upper outlet opening and the front inlet opening.

6. The cabinet of claim 2 wherein the heater exchanger core, the inner duct, and the outer duct comprise a heat exchanger.

7. The cabinet of claim 6 wherein the heat exchanger core has at least one of fins disposed thereon and corrugations formed therein to improve thermal efficiency by increasing surface area.

8. The cabinet of claim 1 wherein the door is hinge mounted to the compartment.

9. The cabinet of claim 1 wherein the door is an inner door and further comprising an outer door mounted over the inner door and spaced therefrom to form a door intake duct, a lower inlet opening of the outer duct opening into the door intake duct, the outer door having at least one ventilation opening to allow entry of the exterior air into the door intake duct.

10. The cabinet of claim 9 and further comprising at least one of sound insulation and thermal insulation applied to an inner surface of the outer door.

11. The cabinet of claim 1 and further comprising at least one of sound insulation and thermal insulation applied to an inner surface of the exhaust duct.

12. The cabinet of claim 1 and further comprising at least one of sound insulation and thermal insulation applied to at least one inner surface of the compartment.

13. The cabinet of claim 9 wherein the inner door extends over a front inlet opening of the exhaust duct and wherein an opening is provided in the inner door to allow for pneumatic coupling of the outer duct to the front inlet opening of the exhaust duct.

14. The cabinet of claim 1 and further comprising a battery compartment for installing batteries to supply DC power to the electronics equipment.

15. The cabinet of claim 1 and further comprising a splice compartment for installing terminal blocks for terminating cables to be accessed by the electronics equipment.

16. The cabinet of claim 1 and further comprising a cable entry compartment for receiving cables to be terminated and to be accessed by the electronics equipment.

17. The cabinet of claim 1 wherein the electronics equipment is telecommunications electronics equipment.

18. The cabinet of claim 1 wherein the cabinet is a weatherproofed cabinet.

19. The cabinet of claim 6 wherein the heat exchanger is a counterflow heat exchanger.

20. The cabinet of claim 9 wherein the lower inlet opening of the outer duct is spaced from the at least one ventilation opening in the outer door.

21. The cabinet of claim 1 wherein the outer duct has a lower inlet opening and the exhaust duct has a rear outlet opening and wherein the lower inlet opening and the rear outlet opening are located on opposite sides of the cabinet.

22. The cabinet of claim 1 wherein the one or more fans are disposed in a fan module coupled between the outer duct and the exhaust duct.

23. The cabinet of claim 2 and further comprising at least one baffle mounted in the compartment to distribute the interior air from a lower outlet opening of the inner duct over the electronic equipment.

24. The cabinet of claim 1 wherein the door is essentially vertical and the exhaust duct is essentially horizontal.

25. The cabinet of claim 1 wherein the compartment is formed in the cabinet.

26. A cabinet for electronics equipment, comprising:
   a compartment for installing the electronics equipment;
   an exhaust duct extending over a top surface of the compartment;
   a door having an open position for providing access to the compartment and a closed position for separating interior air in the compartment from exterior air without, the door having an inner surface facing the interior of the compartment when the door is in the closed position and an outer surface;

a heat exchanger core mounted in the door for transferring heat from the interior air to the exterior air;

an inner duct mounted on the inner surface for circulating the interior air over an inner surface of the heat exchanger core; and, an outer duct mounted on the outer surface and pneumatically coupled to the exhaust duct when the door is in the closed position, the outer duct and the exhaust duct for passing the exterior air over an outer surface of the heat exchanger core and over an inner surface of the exhaust duct to absorb heat therefrom to thereby cool the interior air.

27. The cabinet of claim 26 and further comprising one or more fans for forcing the interior air through the inner duct.

28. The cabinet of claim 27 wherein the one or more fans are disposed in the inner duct.

29. The cabinet of claim 27 wherein the inner duct has an upper inlet opening and a lower outlet opening and wherein the one or more fans are disposed at least one of the upper inlet opening and the lower outlet opening.

30. The cabinet of claim 26 and further comprising one or more fans for forcing the exterior air through the outer duct and exhaust duct.

31. The cabinet of claim 30 wherein the one or more fans are disposed in the outer duct.

32. The cabinet of claim 30 wherein the outer duct has a lower inlet opening and an upper outlet opening, wherein the exhaust duct has a front inlet opening and a rear outlet opening, and wherein the one or more fans are disposed between the upper outlet opening and the front inlet opening.

33. The cabinet of claim 26 wherein the heater exchanger core, the inner duct, and the outer duct comprise a heat exchanger.

34. The cabinet of claim 26 wherein at least one of the inner and outer surfaces of the heat exchanger core has at least one of fins disposed thereon and corrugations formed therein to improve thermal efficiency by increasing surface area.

35. The cabinet of claim 26 wherein the door is hinge mounted to the compartment.

36. The cabinet of claim 35 wherein the door is an inner door and further comprising an outer door mounted over the inner door and spaced therefrom to form a door intake duct, a lower inlet opening of the outer duct opening into the door intake duct, the outer door having at least one ventilation opening to allow entry of the exterior air into the door intake duct.

37. The cabinet of claim 36 and further comprising at least one of sound insulation and thermal insulation applied to an inner surface of the outer door.

38. The cabinet of claim 26 and further comprising at least one of sound insulation and thermal insulation applied to the inner surface of the exhaust duct.

39. The cabinet of claim 26 and further comprising at least one of sound insulation and thermal insulation applied to at least one inner surface of the compartment.

40. The cabinet of claim 36 wherein the inner door extends over a front inlet opening of the exhaust duct and wherein an opening is provided in the inner door to allow for the pneumatic coupling of the outer duct to the front inlet opening of the exhaust duct.

41. The cabinet of claim 26 and further comprising a battery compartment for installing batteries to supply DC power to the electronics equipment.

42. The cabinet of claim 26 and further comprising a splice compartment for installing terminal blocks for terminating cables to be accessed by the electronics equipment.

43. The cabinet of claim 26 and further comprising a cable entry compartment for receiving cables to be terminated and to be accessed by the electronics equipment.

44. The cabinet of claim 26 wherein the electronics equipment is telecommunications electronics equipment.

45. The cabinet of claim 26 wherein the cabinet is a weatherproofed cabinet.

46. The cabinet of claim 33 wherein the heat exchanger is a counterflow heat exchanger.

47. The cabinet of claim 36 wherein the lower inlet opening of the outer duct is spaced from the at least one ventilation opening in the outer door.

48. The cabinet of claim 26 wherein the outer duct has a lower inlet opening and the exhaust duct has a rear outlet opening and wherein the lower inlet opening and the rear outlet opening are located on opposite sides of the cabinet.

49. The cabinet of claim 30 wherein the one or more fans are disposed in a fan module coupled between the outer duct and the exhaust duct.

50. The cabinet of claim 26 and further comprising at least one baffle mounted in the compartment to distribute the interior air from a lower outlet opening of the inner duct over the electronic equipment.

51. The cabinet of claim 26 wherein the door is essentially vertical and the exhaust duct is essentially horizontal.

52. The cabinet of claim 26 wherein the compartment is formed in the cabinet.

\* \* \* \* \*